United States Patent
Dai et al.

(10) Patent No.: US 7,633,154 B2
(45) Date of Patent: Dec. 15, 2009

(54) ENCAPSULATION AND METHODS THEREOF

(75) Inventors: Ming-Ji Dai, Chiayi County (TW);
Chun-Kai Liu, Taipei (TW);
Chih-Kuang Yu, Chiayi (TW);
Shih-Hsien Wu, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 300 days.

(21) Appl. No.: 11/392,721

(22) Filed: Mar. 30, 2006

(65) Prior Publication Data

US 2007/0187815 A1 Aug. 16, 2007

(30) Foreign Application Priority Data

Feb. 13, 2006 (TW) .............................. 95104730 A

(51) Int. Cl.
*H01L 23/34* (2006.01)
(52) U.S. Cl. ........................... 257/712; 257/81; 257/99; 257/717; 257/719; 257/722; 257/723; 257/E25.021; 62/3.2; 62/3.7
(58) Field of Classification Search ................. 257/717, 257/930, 723, 712, 98, 718, 722, 726, 731–733, 257/81, 88, 99, E25.021
See application file for complete search history.

(56) References Cited

U.S. PATENT DOCUMENTS

| | | | | |
|---|---|---|---|---|
| 4,837,586 A * | 6/1989 | Brownstein | .................. | 347/205 |
| 5,857,767 A | 1/1999 | Hochstein | | |
| 6,410,971 B1 * | 6/2002 | Otey | ........................... | 257/467 |
| 6,713,862 B2 * | 3/2004 | Palanisamy et al. | .......... | 257/703 |
| 7,095,187 B2 * | 8/2006 | Young | ........................ | 315/360 |
| 7,129,640 B2 * | 10/2006 | Flower | ........................ | 315/120 |
| 2004/0052077 A1 | 3/2004 | Shih | | |
| 2004/0065894 A1 * | 4/2004 | Hashimoto et al. | .......... | 257/100 |

FOREIGN PATENT DOCUMENTS

| | | | | |
|---|---|---|---|---|
| JP | 59-27568 | * | 2/1984 | .................. 257/99 |
| JP | 4-188861 A | | 7/1992 | |
| JP | 2004-95746 | * | 3/2004 | |
| JP | 2005-64168 A | | 3/2005 | |
| TW | 586683 | | 5/2004 | |
| TW | M259903 | | 3/2005 | |
| TW | M261837 | | 4/2005 | |
| TW | M286464 | | 1/2006 | |
| WO | WO-2005/111715 A2 | | 11/2005 | |

* cited by examiner

*Primary Examiner*—Jasmine J Clark
(74) *Attorney, Agent, or Firm*—Birch, Stewart, Kolasch & Birch, LLP

(57) ABSTRACT

The invention discloses an encapsulation comprising a metal substrate, a PCB on the metal substrate, a thermo-electric element in and/or on the PCB, and an LED on the thermo-electric element. Encapsulating methods are also provided by the invention.

12 Claims, 18 Drawing Sheets

ENCAPSULATION AND METHODS THEREOF

BACKGROUND OF THE INVENTION

1. Field of the Invention

The present invention relates to an encapsulation and fabrication methods thereof, and in particular to methods for integrating a thermo-electric element with a metal printed circuit board (PCB) and the resultant encapsulation.

2. Description of the Related Art

A thermo-electric element, also called a cooling device, utilizes active cooling techniques, while conventional fins use passive cooling techniques. Compared to conventional fins, the thermo-electric element features low noise, low pollution, long lifetime, easy set-up. Further, it is compact and can continuously work without using any cooling agents. The thermo-electric element is therefore appropriate to meet the demands of high-power electronic devices such as integrated circuits or light emitting diodes.

A metal PCB is widely used by IC or light emitting diode manufactures due to the heat dissipation efficiency thereof.

A light emitting diode include suffers from problems, e.g. heat dissipation, during operation, and generated heat which significantly affects luminescence and lifetime thereof. Accordingly, a method for eliminating the described problems is desirable.

BRIEF SUMMARY OF THE INVENTION

"Encapsulation" used hereinafter refers to an integrated device in which a metal printed circuit board (PCB) is integrated with a thermo-electric element.

In accordance with one aspect of the invention, an encapsulation comprising a metal substrate, a PCB on the metal substrate, a thermo-electric element in and/or on the PCB, and an LED on the thermo-electric element is disclosed. In another preferred embodiment of the invention, the encapsulation further comprises an insulating layer interposed between the metal substrate and the first PCB. In another preferred embodiment of the invention, the encapsulation further comprises a dielectric layer on the first thermo-electric element, wherein the dielectric layer comprises a plurality of trenches. In yet another preferred embodiment of the invention, the encapsulation further comprises a heat dissipation module. In yet another preferred embodiment of the invention, the encapsulation further comprises a connector, a driving IC and a resistor.

In accordance with another aspect of the invention, an encapsulating method is presented. The method comprises providing a PCB, wherein the PCB includes a copper layer; patterning the copper layer to form a plurality of first electrodes, and exposing a portion of the PCB surface; forming a plurality of P-type electrodes and N-type electrodes on the first electrodes; forming a plurality of second electrodes on the P-type and N-type electrodes, wherein the first electrode, the P-type electrode, the N-type electrode, and the second electrode constitute a thermo-electric element; forming a light emitting diode on the thermo-electric element; and attaching the PCB to a metal substrate by a method such as lamination or adhesion.

In accordance with another aspect of the invention, an encapsulating method is presented, comprising disposing a first PCB on a second PCB, wherein the second PCB includes a copper layer sandwiched between the first PCB and the second PCB; forming a plurality of openings in the first PCB, and exposing a portion of the copper layer surface; patterning the copper layer to form a plurality of first electrodes, and exposing a portion of the second PCB surface; forming a plurality of P-type electrodes and N-type electrodes on the first electrodes; forming a plurality of second electrodes on the P-type and N-type electrodes, wherein the first electrode, the P-type electrode, the N-type electrode, and the second electrode constitute a thermo-electric element; forming a light emitting diode on the thermo-electric element; and attaching the PCB to a metal substrate by a method such as lamination or adhesion.

The heat dissipation efficiency of the light emitting diode, PCB, connector, driving IC, and resistor is effectively enhanced by integrating the thermo-electric device with the metal PCB, thus, device performance is improved. For example, both luminescence and lifetime are dramatically increased. Further, the addition of an appropriate heat dissipation module can achieve advanced heat dissipation efficiency.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

First Embodiment

Figure 1A:
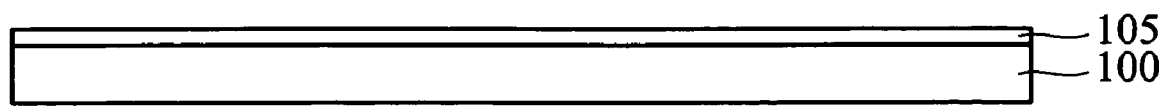
FIGS. 1a~1h are cross sections of a fabrication method of an encapsulation in accordance with one preferred embodiment of the invention.

FIGS. 1a~1h are cross sections of a fabrication method of an encapsulation in accordance with one preferred embodiment of the invention As shown in FIG. 1a, a PCB 100 with a copper layer 105 is provided.

Figure 1B:

As shown in FIG. 1b, the copper layer is patterned to form a plurality of first electrodes 105a, and exposing a portion of the PCB surface.

Figure 1C:
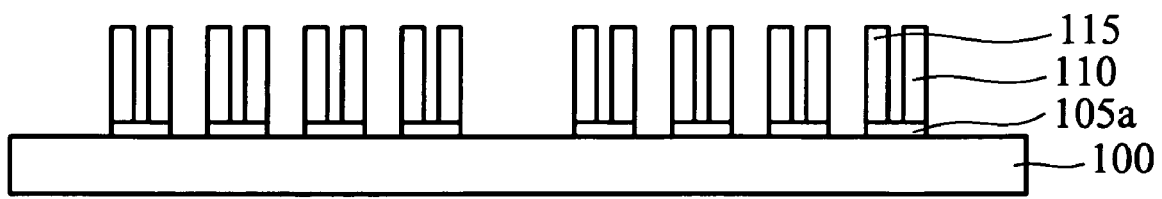

As shown in FIG. 1c, a plurality of P-type electrodes 115 and N-type electrodes 110 are formed on the first electrodes 105a. Specifically, the first electrodes 105a are formed using an engraving machine. In other embodiments, the first electrodes 105a are formed by means of a laser treatment or an etching process.

Figure 1D:
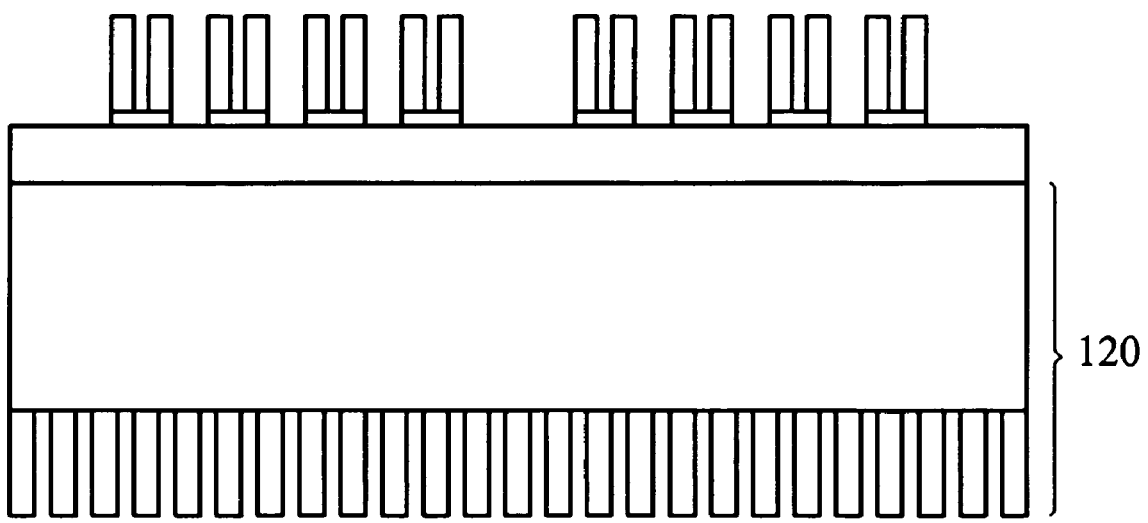

As shown in FIG. 1d, the PCB 100 is attached to a metal substrate 120 by a method of lamination or adhesion.

Figure 1E:
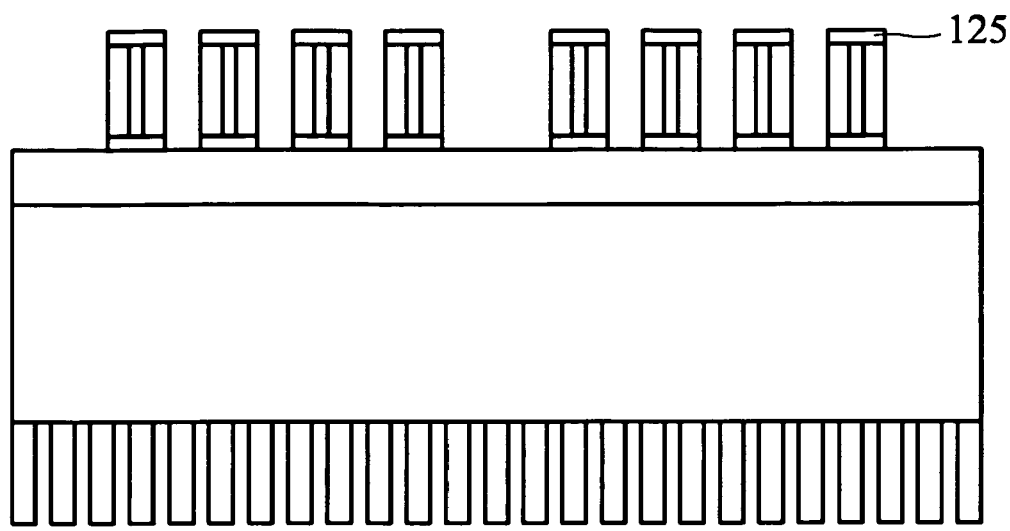

As shown in FIG. 1e, a plurality of second electrodes 125 are formed on the P-type electrodes 115 and N-type electrodes 110. The first electrode 105a, the P-type electrode 115, the N-type electrode 110, and the second electrode 125 constitute a thermo-electric element.

Figure 1F:
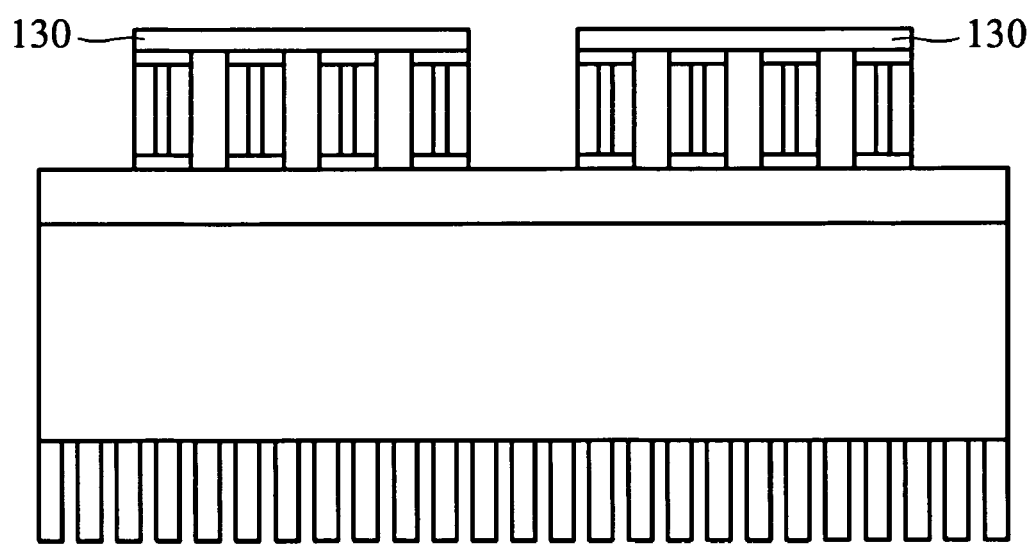

As shown in FIG. 1f, an anode 130 is formed on the second electrode 125.

Figure 1G:
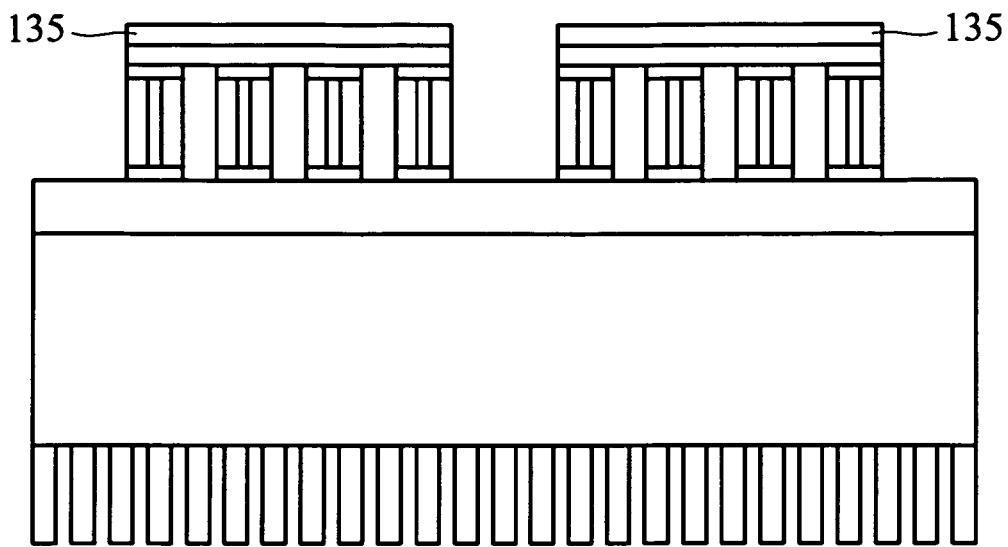

As shown in the FIG. 1g, a light emitting layer 135 is formed on the anode 130.

Figure 1H:
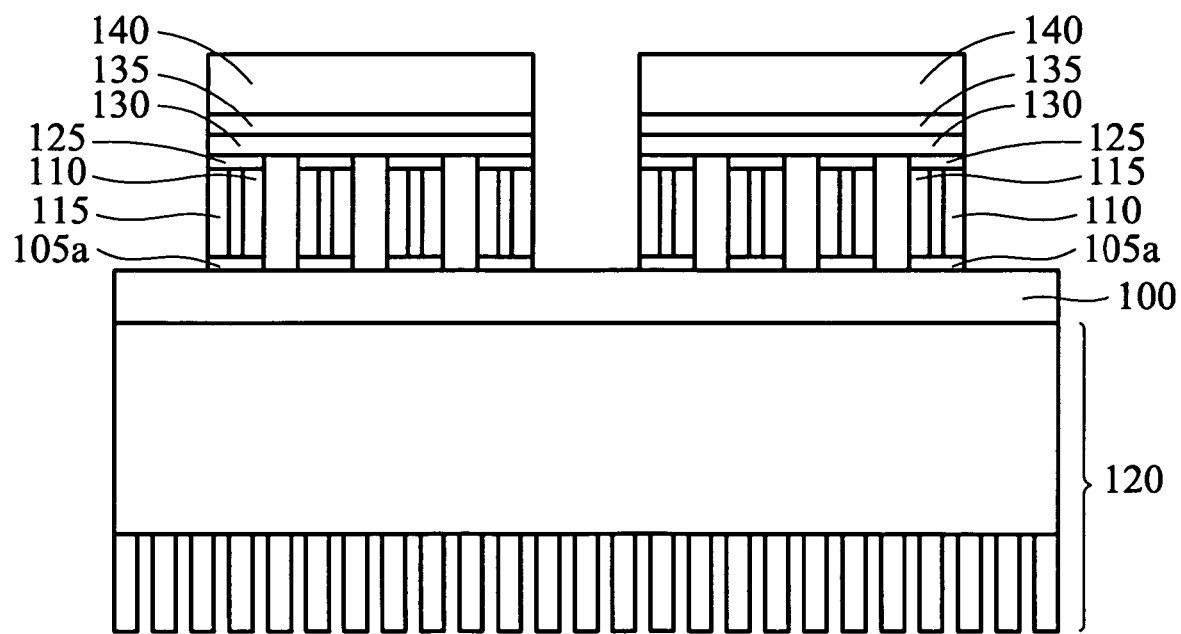

As shown in the FIG. 1h, a cathode 140 is formed on the light emitting layer 135. The anode 130, the light emitting layer 135 and the cathode 140 consist of a light emitting diode disposed on the thermo-electric element.

Heat generated by the lighting of the light emitting diode is conducted by means of the underlying thermo-electric element to the environment. In other various embodiments, formation of the thermo-electric element and the light emitting diodes on the PCB can be performed prior to attachment of the BCB to the metal substrate. Attachment of the BCB to the metal substrate may be performed by means of lamination or adhesion.

Second Embodiment

FIGS. 2a~2h are cross sections of a fabrication method of an encapsulation in accordance with another preferred embodiment of the invention.

Figure 2A:
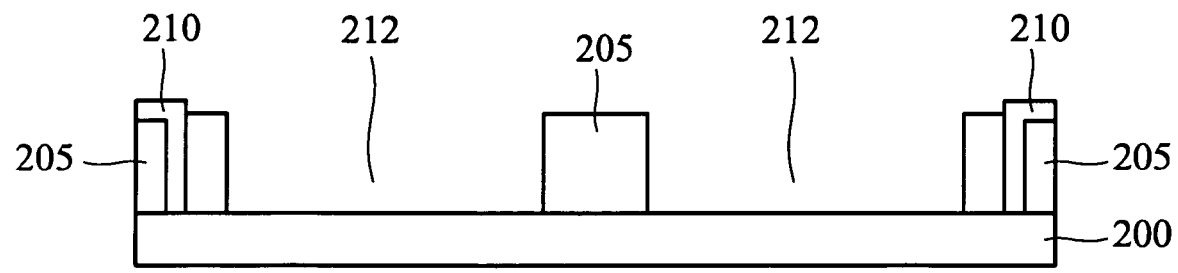
FIGS. 2a~2h are cross sections of a fabrication method of an encapsulation in accordance with another preferred embodiment of the invention.

As shown in the FIG. 2a, a first PCB 205 is disposed on a second PCB 200. The second PCB 200 includes a copper layer (not shown) sandwiched between the first PCB 205 and the second PCB 200. In addition, the first PCB 205 includes many contacts 210 and openings 212 therein, and the openings 212 expose a portion of the copper layer surface.

Figure 2B:
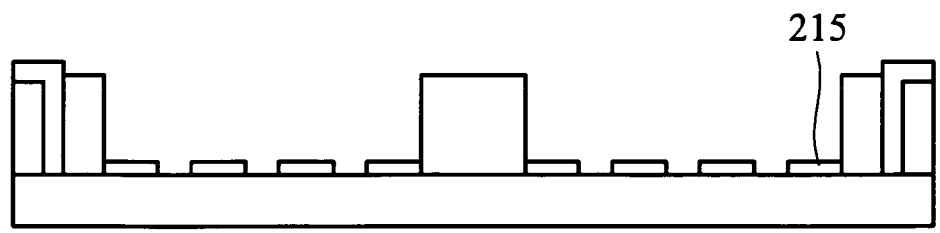

As shown in the FIG. 2b, the copper layer is patterned to form a plurality of first electrodes 215, and expose a portion of the surface of the second PCB 20. Specifically, the first electrodes 215 are formed using an engraving machine. In other embodiments, the first electrodes 215 are formed by means of a laser treatment or an etching process.

Figure 2C:
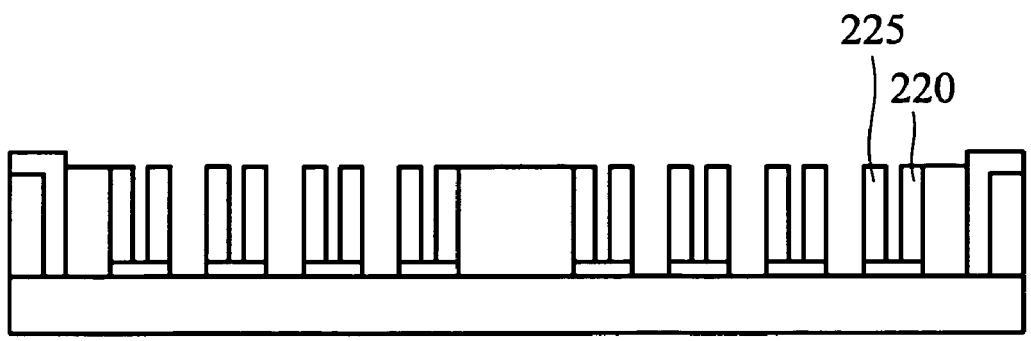

As shown in the FIG. 2c, a plurality of P-type electrodes 225 and N-type electrodes 220 are formed on the first electrodes 215.

Figure 2D:
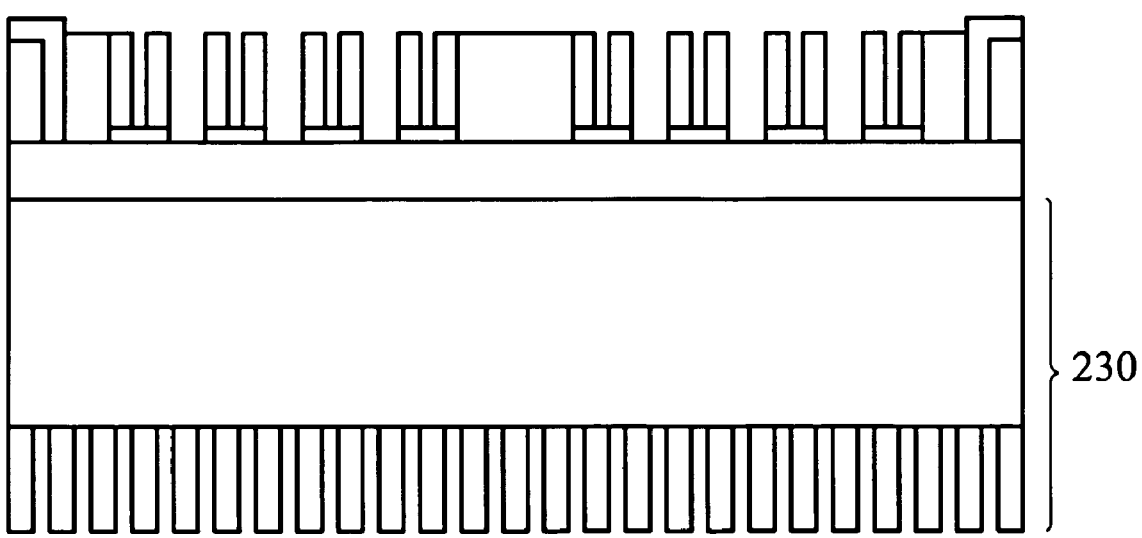

As shown in the FIG. 2d, the stacked PCBs 200, 205 are attached to a metal substrate 230 by means of lamination or adhesion.

Figure 2E:
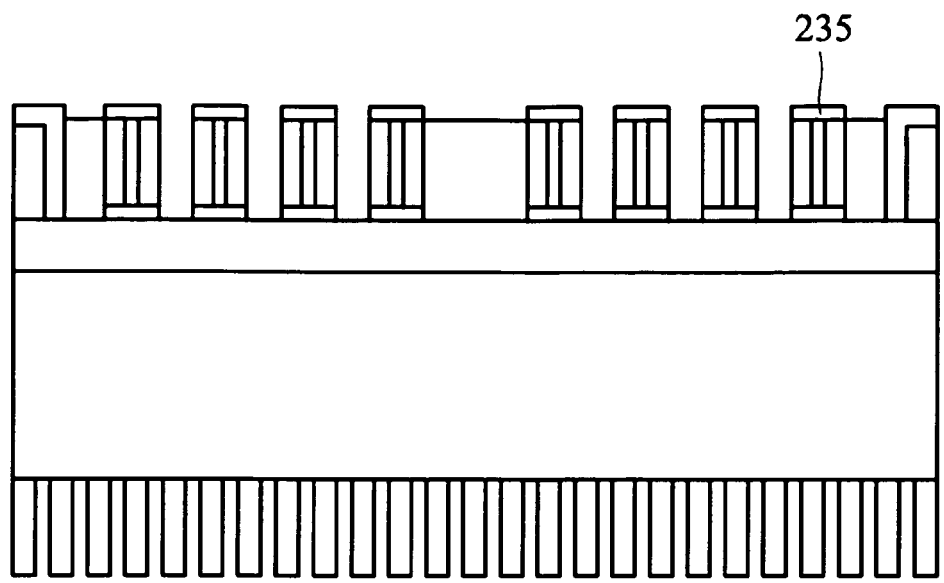

As shown in the FIG. 2e, a plurality of second electrodes 235 are formed on the P-type electrodes 225 and N-type electrodes 220. The first electrode 215, the P-type electrode 225, the N-type electrode 220, and the second electrode 235 constitute a thermo-electric element.

Figure 2F:
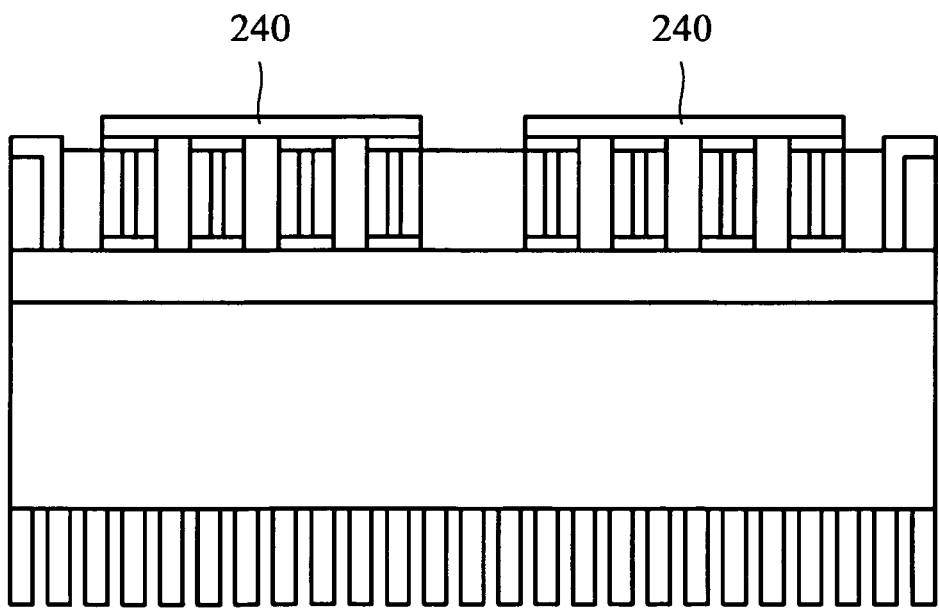

As shown in the FIG. 2f, an anode 240 is formed on the second electrode 235.

Figure 2G:
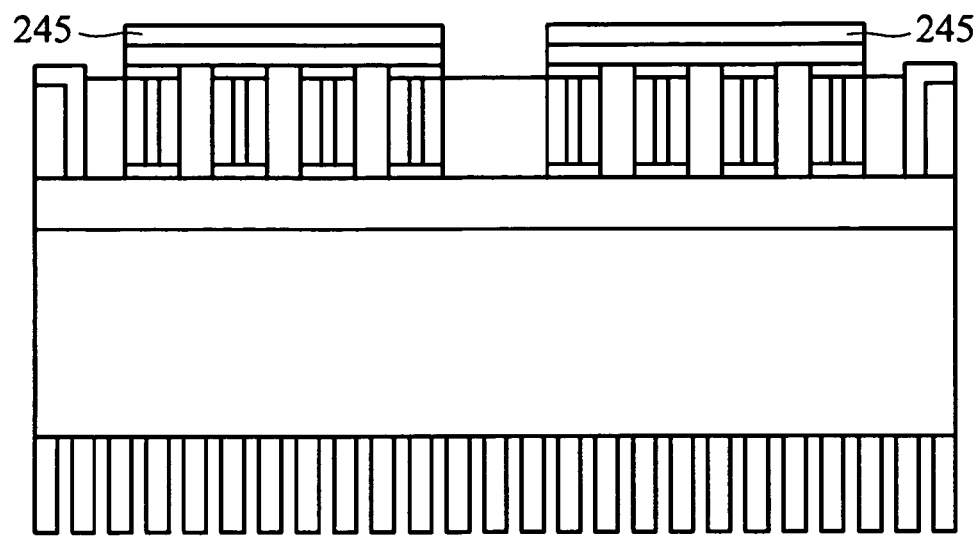

As shown in the FIG. 2g, a light emitting layer 245 is formed on the anode 240.

Figure 2H:
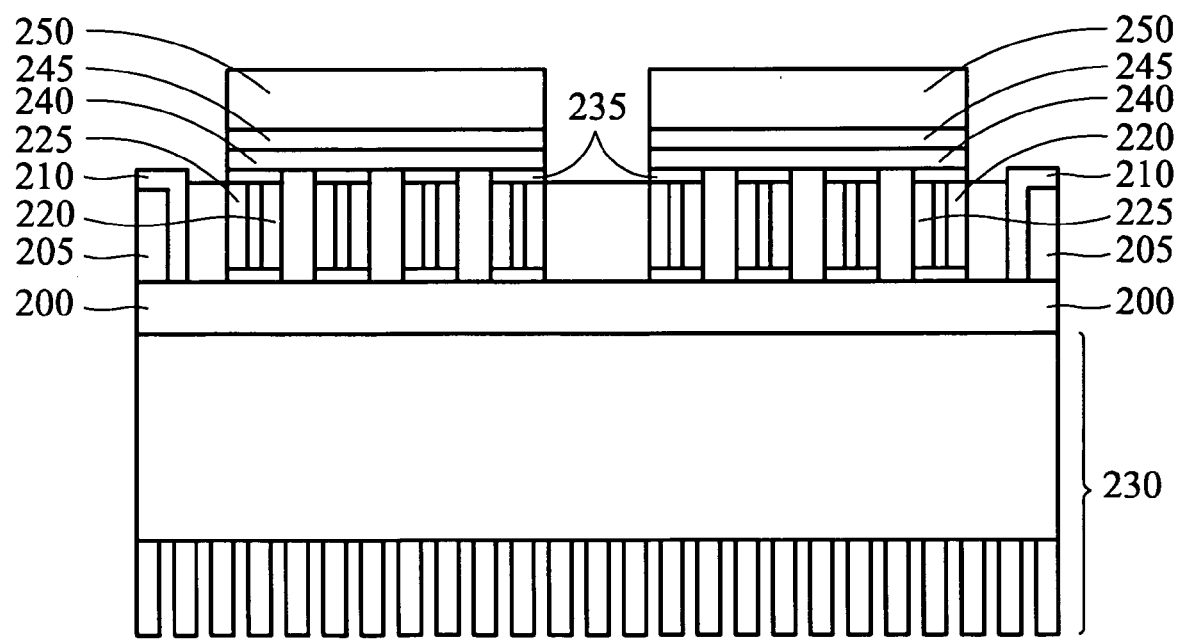

As shown in the FIG. 2h, a cathode 250 is formed on the light emitting layer 245. The anode 240, the light emitting layer 245 and the cathode 250 consist of a light emitting diode disposed on the thermo-electric element.

Heat generated by the lighting of the light emitting diode is conducted by means of the underlying thermo-electric element to the environment. In other various embodiments, after formation of the thermoelectric element in the PCB and formation of the light emitting diodes on the thermo-electric element, attachment of the BCB to the metal substrate is then performed. Attachment of the BCB to the metal substrate may be performed by means of lamination or adhesion.

Third Embodiment

Figure 3A:
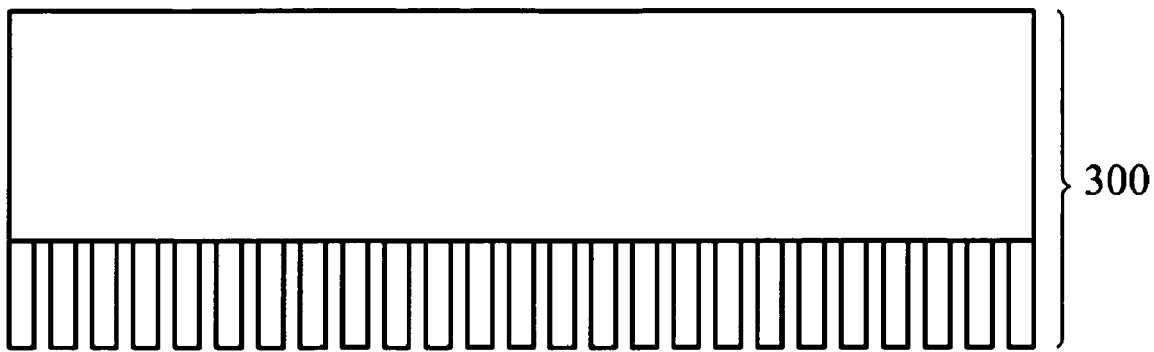
FIGS. 3a~3e are cross sections of a fabrication method of an encapsulation in accordance with another preferred embodiment of the invention.

FIGS. 3a~3e are cross sections of a fabrication method of an encapsulation in accordance with another preferred embodiment of the invention As shown in the FIG. 3a, provide a metal substrate 300.

Figure 3B:
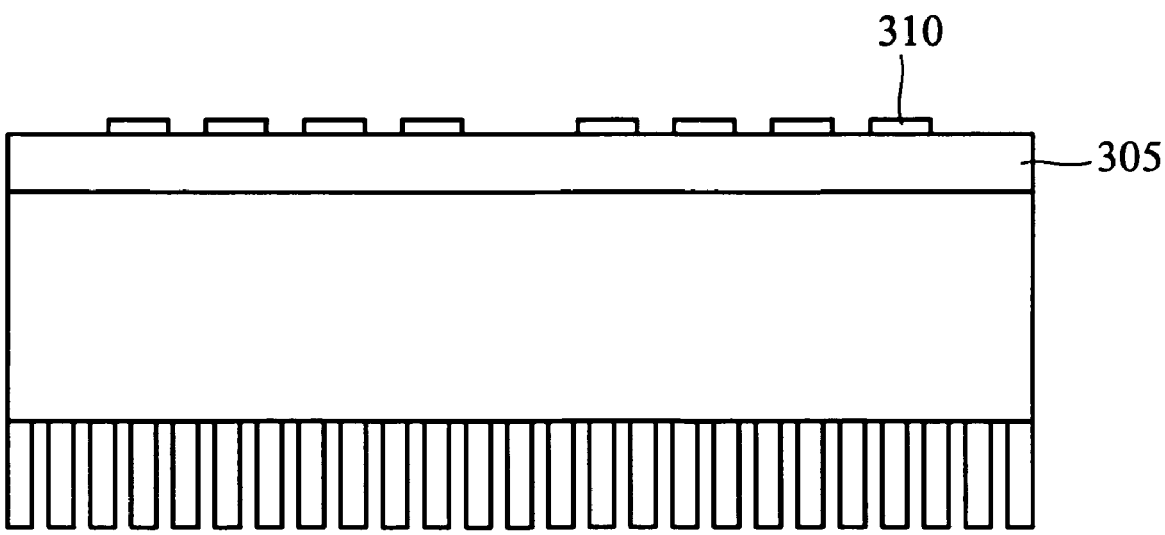

As shown in the FIG. 3b, a PCB 305 is formed on the metal substrate 300, and a plurality of first electrodes 310 are then formed on the PCB 305 by patterning the copper layer (not shown) of the PCB 305. Formation of the first electrodes 310 includes the use of an engraving machine. In other exemplary embodiments, the first electrodes 310 are formed utilizing a laser treatment or an etching process.

Figure 3C:
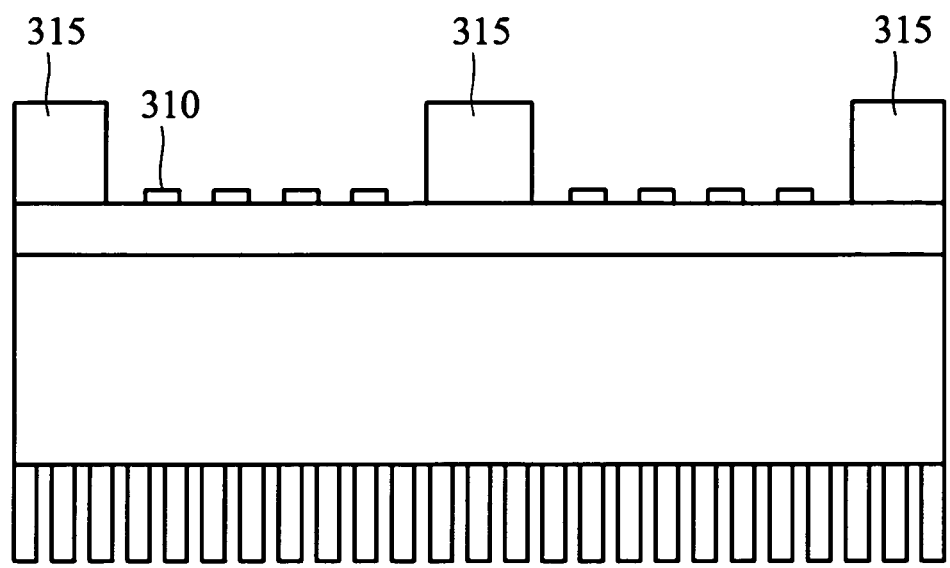

As shown in the FIG. 3c, a dielectric layer 315 including a plurality of openings is formed on the PCB 305.

Figure 3D:
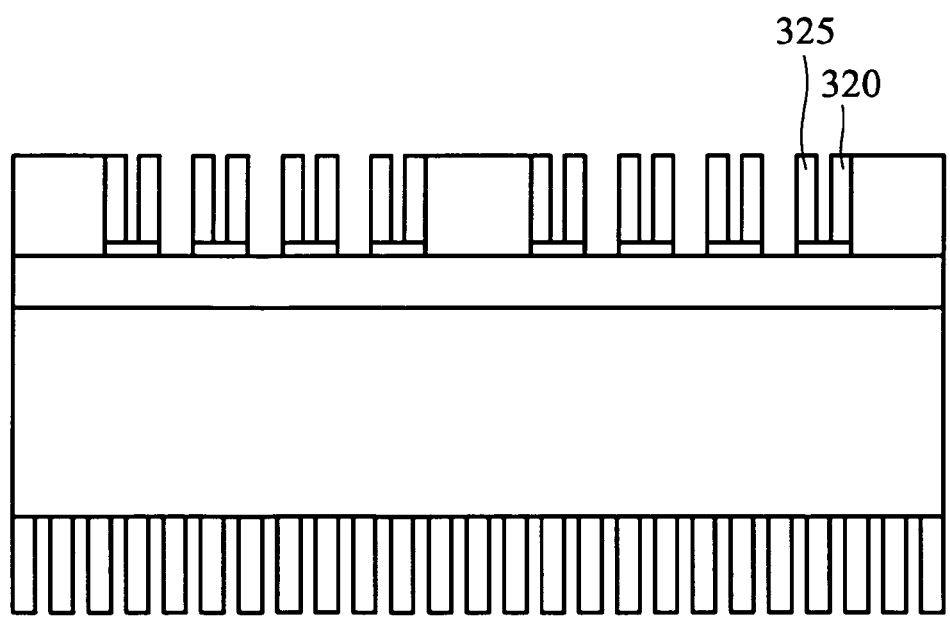

As shown in the FIG. 3d, a plurality of P-type electrodes 325 and N-type electrodes 320 are formed on the first electrodes 310.

Figure 3E:
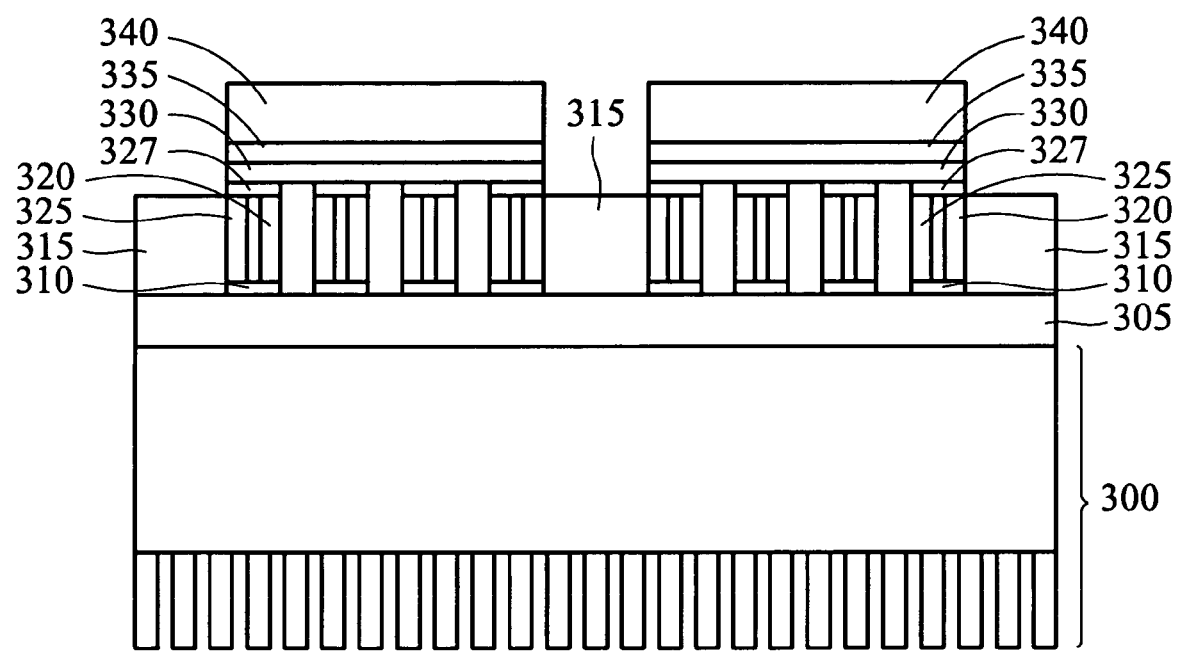

As shown in the FIG. 3e, a plurality of second electrodes 327 are formed on the P-type electrodes 325 and N-type electrodes 320. The first electrode 310, the P-type electrode 325, the N-type electrode 320, and the second electrode 327 constitute a thermo-electric element. Subsequently, a light emitting diode consisting of an anode 330, a light emission layer 335 and a cathode 340 is disposed on each thermoelectric element.

Fourth Embodiment

Figure 4:
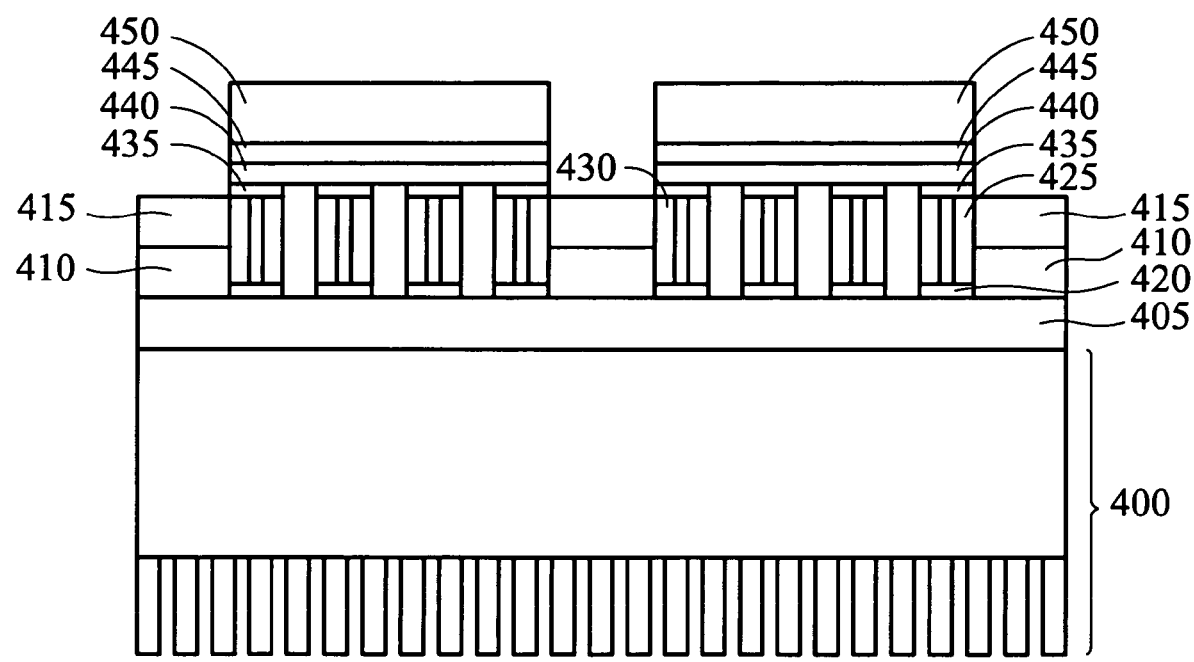
FIG. 4 is a schematic view showing an encapsulation in accordance with another preferred embodiment of the invention.

FIG. 4 is a schematic view showing an encapsulation in accordance with another preferred embodiment of the invention In this embodiment, the encapsulation includes a metal substrate 400, an insulating layer 405 on the metal substrate 400, a metal layer 410 including openings on the insulating layer 405, a dielectric layer 415 including the same openings on the metal layer 410, thermo-electric devices respectively formed in each opening, and light emission diodes respectively formed in each thermo-electric device. The thermo-electric device includes a first electrode 420, a P-type electrode 430, an N-type electrode 425, and a second electrode 435. The light emission diode includes an anode 440, a light emission layer 445 and a cathode 450.

Fifth Embodiment

Figure 5:
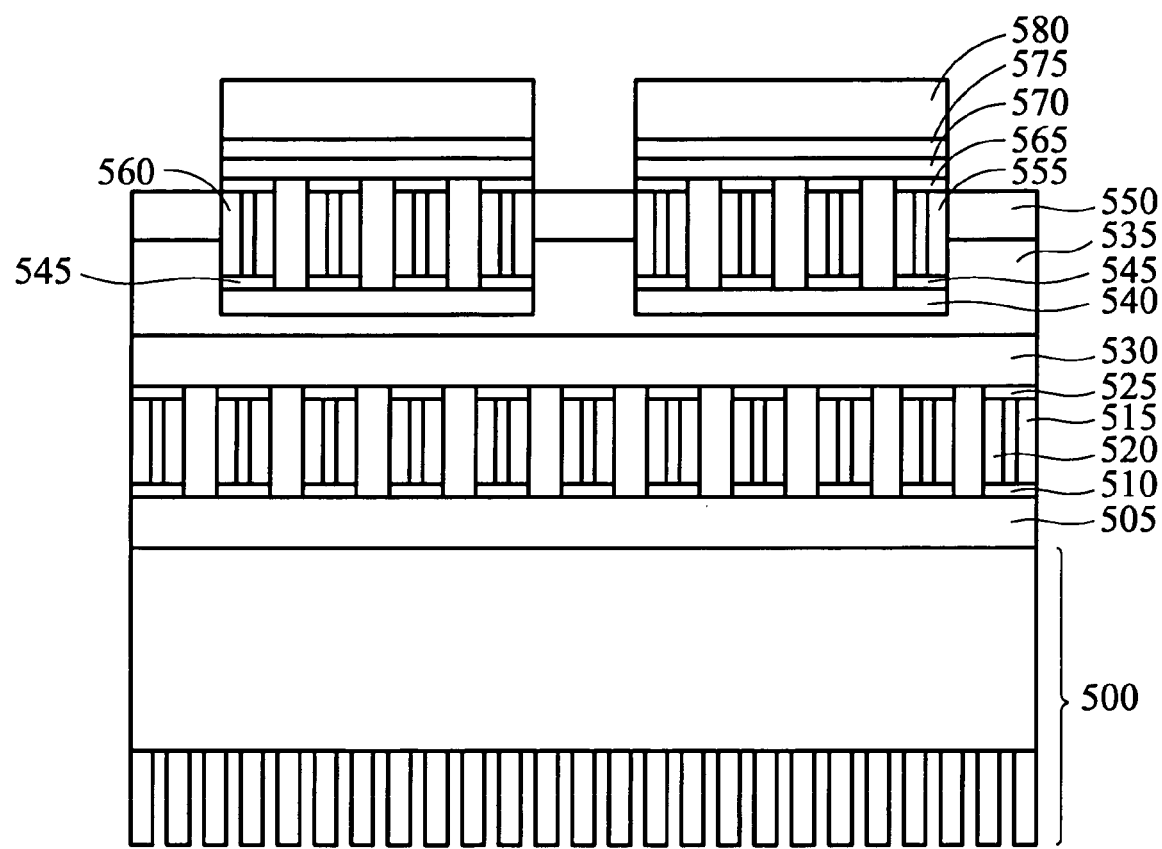
FIG. 5 is a schematic view showing an encapsulation in accordance with another preferred embodiment of the invention.

FIG. 5 is a schematic view showing an encapsulation in accordance with another preferred embodiment of the invention. This embodiment features a stacked thermo-electric device.

In this embodiment, the encapsulation includes a metal substrate 500, an insulating layer 505 on the metal substrate 500, a first thermo-electric device on the insulating layer 505, an insulating layer 530 on the first thermoelectric device, a metal layer 535 including the openings on the insulating layer 530, a dielectric layer 550 including the same openings on the metal layer 535, second thermo-electric devices respectively formed in each opening, and light emission diodes. The first thermoelectric device includes an electrode 510, a P-type electrode 520, an N-type electrode 515, and an electrode 525.

The second thermo-electric device includes an electrode 545, a P-type electrode 560, an N-type electrode 555, and an electrode 565. The light emission diode includes an anode 570, a light emission layer 575 and a cathode 580.

Sixth Embodiment

Figure 6:
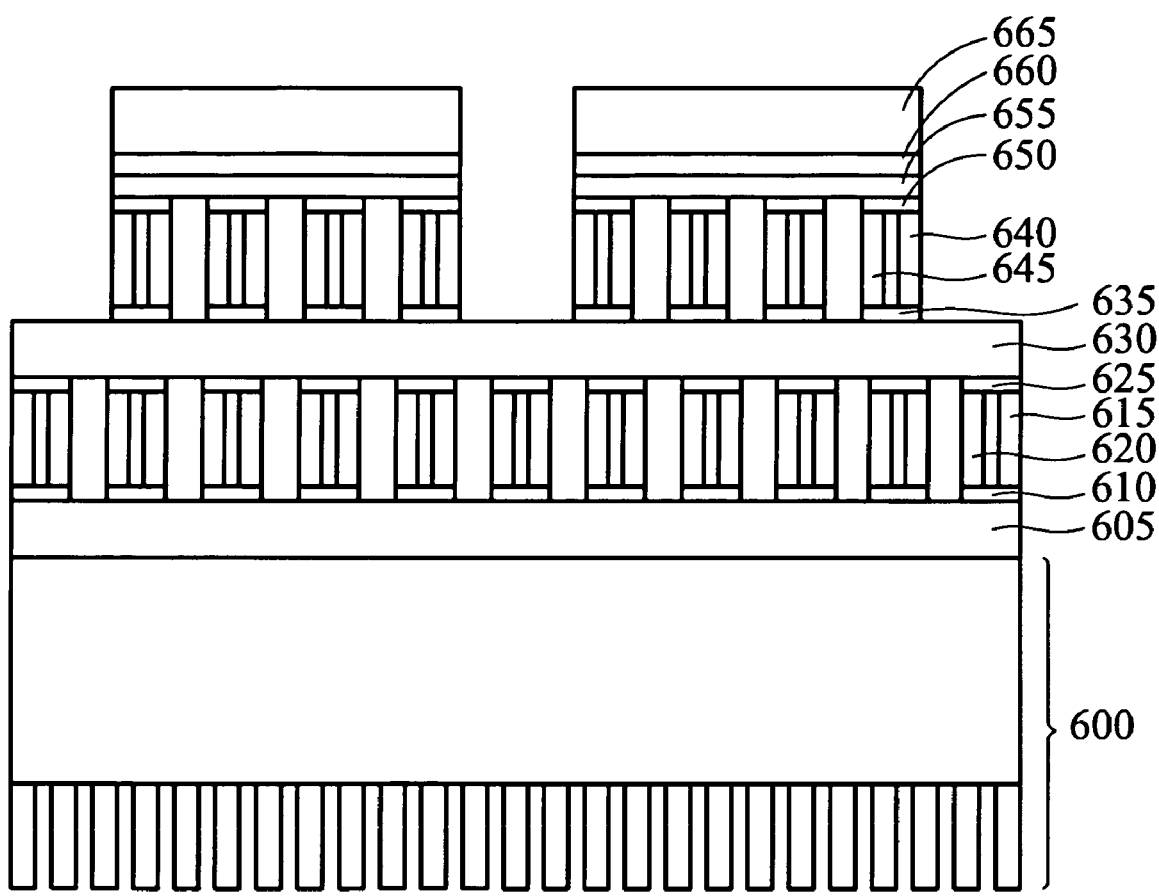
FIG. 6 is a schematic view showing an encapsulation in accordance with another preferred embodiment of the invention.

FIG. 6 is a schematic view showing an encapsulation in accordance with another preferred embodiment of the invention. This embodiment also features a stacked thermo-electric device.

In this embodiment, the encapsulation includes a metal substrate 600, an insulating layer 605 on the metal substrate 600, a first thermo-electric device on the insulating layer 605, an insulating layer 630 on the first thermo-electric device, second thermo-electric devices arranged on the insulating layer 630 by a predetermined spacing, and light emission diodes on the second thermo-electric devices. The first thermoelectric device includes an electrode 610, a P-type electrode 620, an N-type electrode 615, and an electrode 565. The second thermoelectric device includes an electrode 635, a P-type electrode 645, an N-type electrode 640, and an electrode 650. The light emission diode includes an anode 655, a light emission layer 660 and a cathode 665.

Seventh Embodiment

Figure 7:
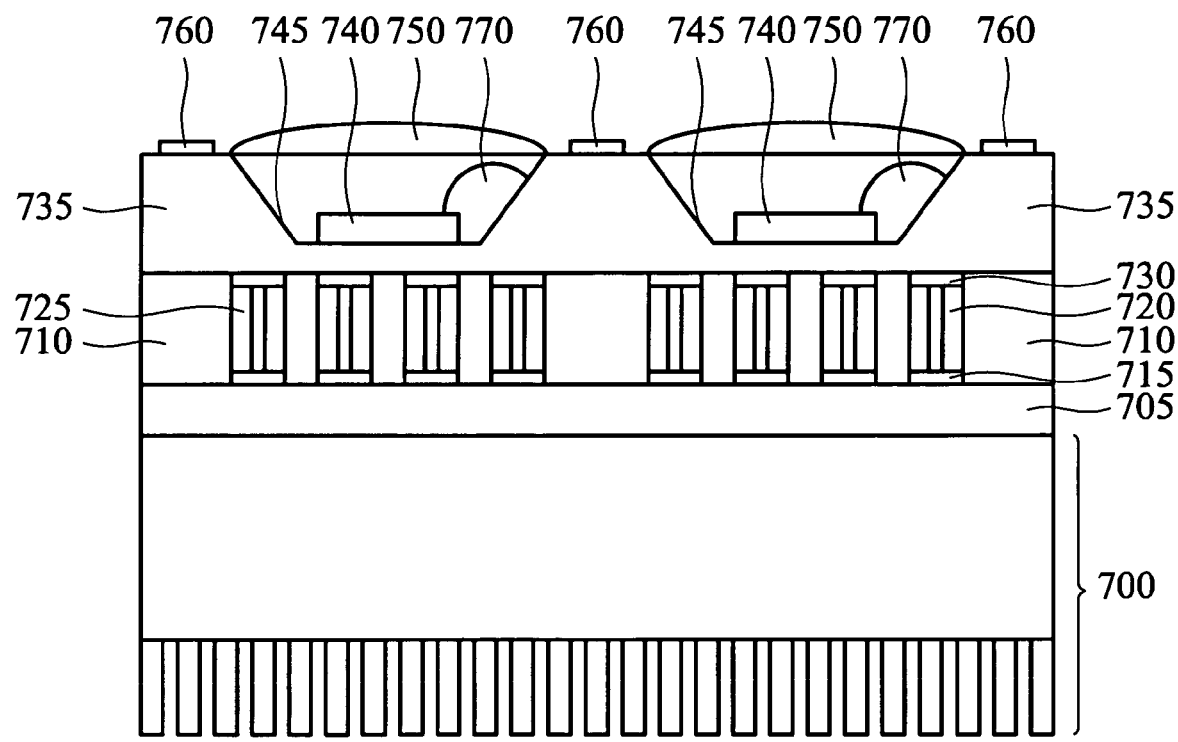
FIG. 7 is a schematic view showing an encapsulation in accordance with another preferred embodiment of the invention.

FIG. 7 is a schematic view showing an encapsulation in accordance with another preferred embodiment of the invention.

In this embodiment, the encapsulation includes a metal substrate 700, an insulating layer 705 on the metal substrate 700, a metal layer 710 including first openings on the insulating layer 705, thermo-electric devices respectively disposed in each first opening, a dielectric layer 735 including trenches on the metal layer 710, light emitting diodes 740 respectively formed in each trench, lens 750, electrodes 760, and metal bonding 770. Specifically, the surface of each trench is coated with a reflective film 745. The thermo-electric device includes a first electrode 715, a P-type electrode 725, an N-type electrode 720, and a second electrode 730.

Eighth Embodiment

Figure 8:
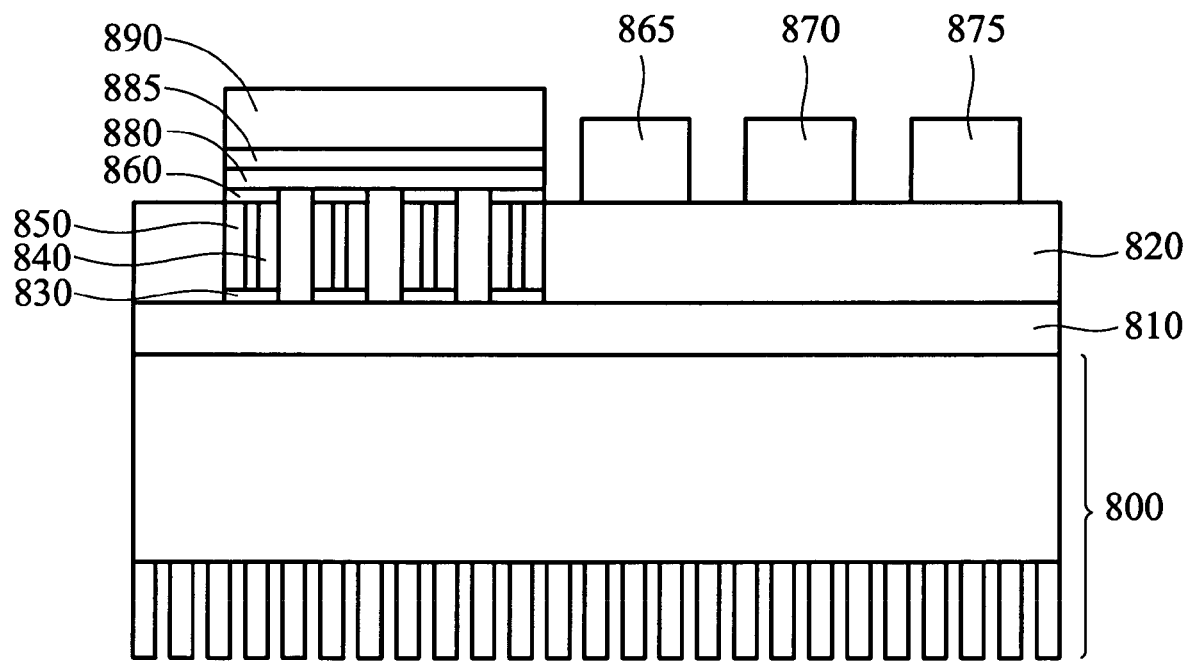
FIG. 8 is a schematic view showing an encapsulation in accordance with another preferred embodiment of the invention.

FIG. 8 is a schematic view showing an encapsulation in accordance with another preferred embodiment of the invention In this embodiment, the encapsulation includes a metal substrate 800, an insulating layer 810 on the metal substrate 800, a metal layer 820 including openings on the insulating layer 810, thermo-electric devices respectively disposed in each opening, light emitting diodes on the thermo-electric devices. The encapsulation also comprises a connector 875, a driving IC 865 and a resistor 870 separately disposed on the metal layer 820. The thermo-electric device includes a first electrode 830, a P-type electrode 850, an N-type electrode 840, and a second electrode 860. The light emission diode includes an anode 880, a light emission layer 885 and a cathode 890.

Ninth Embodiment

Figure 9:
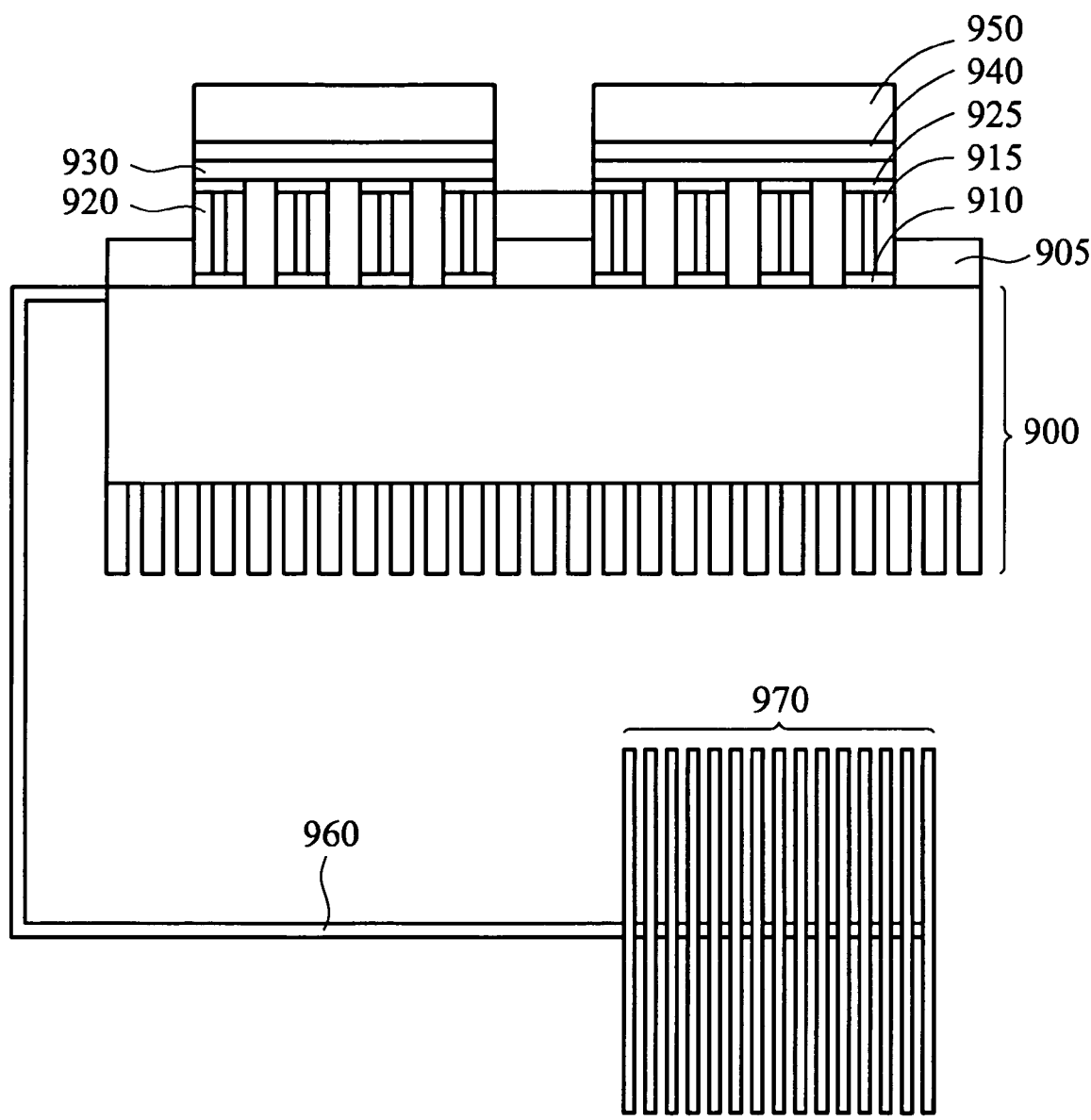
FIG. 9 is a schematic view showing an encapsulation in accordance with another preferred embodiment of the invention.

FIG. 9 is a schematic view showing an encapsulation in accordance with another preferred embodiment of the invention.

This embodiment connects the encapsulation presented in first, second, or other embodiments to a heat dissipation module. The heat dissipation module can be composed mainly of a heat pipe 960 and a fin 970, and the metal substrate 900 is connected to the fin 970 through the heat pipe 960.

Tenth Embodiment

Figure 10:
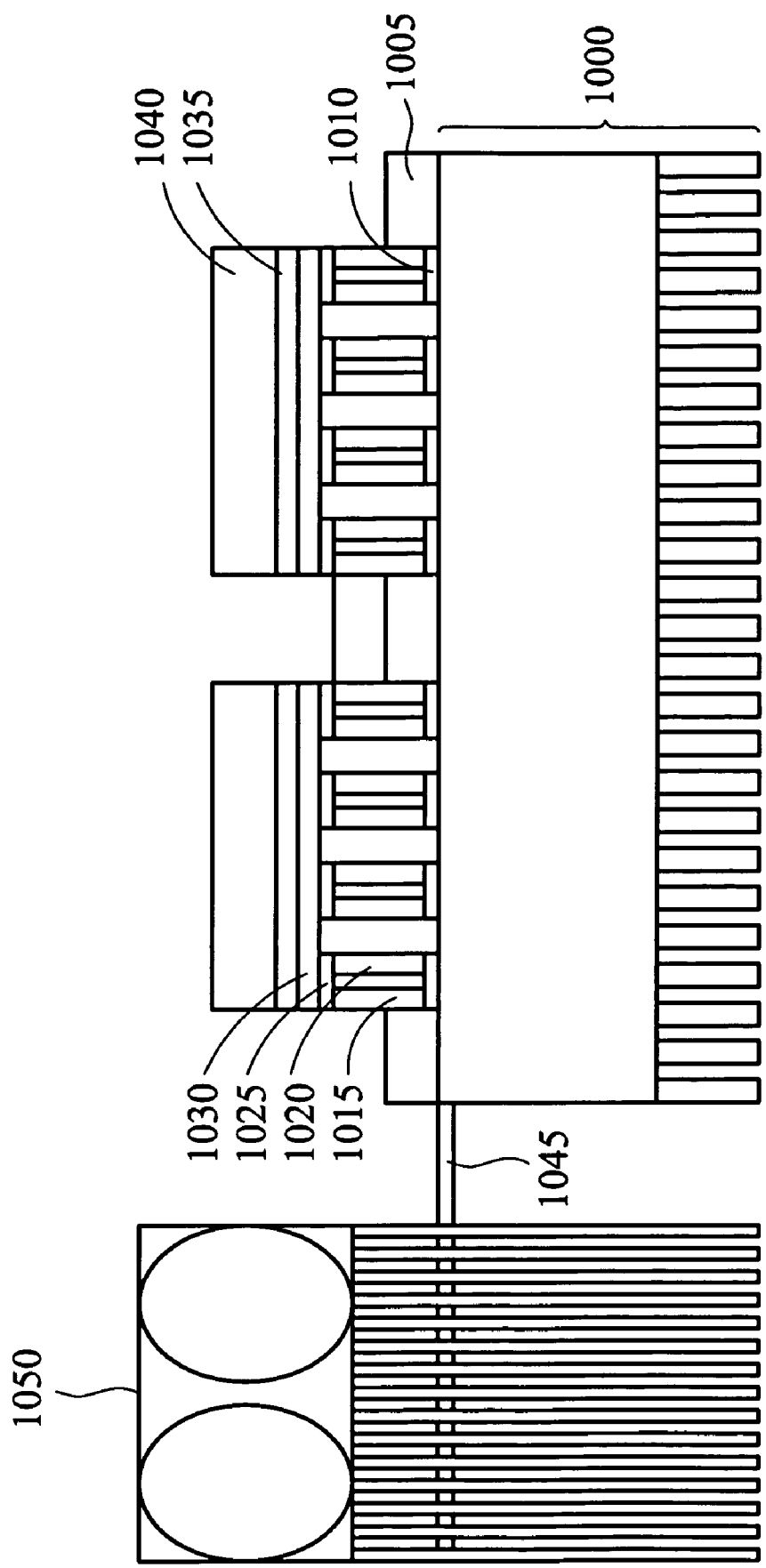
FIG. 10 is a schematic view showing an encapsulation in accordance with another preferred embodiment of the invention.

FIG. 10 is a schematic view showing an encapsulation in accordance with another preferred embodiment of the invention.

Similarly, this embodiment connects the encapsulation presented in first, second, or other embodiments to a heat dissipation module. The heat dissipation module can be composed mainly of a heat pipe 1045 and a fan system 1050, and the metal substrate 1000 is connected to the fan system 1050 through the heat pipe 1045.

The heat dissipation efficiency of the light emitting diode, PCB, connector, driving IC, and resistor is effectively enhanced by integrating the thermo-electric device with the metal PCB, thus performance of the device is improved. For example, both luminescence and lifetime are dramatically increased. Further, the addition of an appropriate heat dissipation module can achieve advanced heat dissipation efficiency.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An encapsulation, comprising:
   a metal substrate;
   a first PCB on the metal substrate;
   a first thermo-electric element comprising a plurality of P-type electrodes, n-type electrodes and first electrodes, said first thermo-electric element being directly disposed on the first PCB, wherein the P-type electrodes are electrically connected to the n-type electrodes through the first electrodes; and
   a first light emitting diode on the first thermo-electric element, said first light emitting diode being directly in contact with the first thermo-electric element.

2. The encapsulation as claimed in claim 1, further comprising an insulating layer interposed between the metal substrate and the first PCB.

3. The encapsulation as claimed in claim 1, wherein the first electrodes are formed of a copper layer of the first PCB.

4. The encapsulation as claimed in claim 3, wherein the first thermo-electric element is a stack.

5. The encapsulation as claimed in claim 3, further comprising a dielectric layer on the first thermo-electric element, wherein the dielectric layer comprises a plurality of trenches.

6. The encapsulation as claimed in claim 5, wherein each trench comprises a reflective film on a surface thereof.

7. The encapsulation as claimed in claim 6, wherein each trench comprises a second light emitting diode therein.

8. The encapsulation as claimed in claim 7, further comprising lens respectively disposed over each trench.

9. The encapsulation as claimed in claim 3, further comprising a heat dissipation module.

10. The encapsulation as claimed in claim 4, further comprising a connector, a driving IC and a resistor.

11. The encapsulation as claimed in claim 1, wherein the metal substrate comprises Al or Cu.

12. An encapsulation, comprising:
   a metal substrate;
   a first PCB on the metal substrate;
   a first thermo-electric element comprising a plurality of P-type electrodes, n-type electrodes and first electrodes, said first thermo-electric element being disposed in the first PCB, wherein the P-type electrodes are electrically connected to the n-type electrodes through the first electrodes; and
   a light emitting diode on the first thermo-electric element, said light emitting diode being directly in contact with the first thermo-electric element.

* * * * *

UNITED STATES PATENT AND TRADEMARK OFFICE
CERTIFICATE OF CORRECTION

| | | |
|---|---|---|
| PATENT NO. | : 7,633,154 B2 | Page 1 of 1 |
| APPLICATION NO. | : 11/392721 | |
| DATED | : December 15, 2009 | |
| INVENTOR(S) | : Dai et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 560 days.

Signed and Sealed this

Twenty-first Day of December, 2010

David J. Kappos
*Director of the United States Patent and Trademark Office*